(12) United States Patent
Matsuo et al.

(10) Patent No.: US 10,857,826 B2
(45) Date of Patent: Dec. 8, 2020

(54) PHOTOSENSITIVE CTP FLEXOGRAPHIC PRINTING ORIGINAL PLATE

(71) Applicant: TOYOBO CO., LTD., Osaka (JP)

(72) Inventors: Keisuke Matsuo, Otsu (JP); Hiromichi Yonekura, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 16/487,231

(22) PCT Filed: Mar. 27, 2018

(86) PCT No.: PCT/JP2018/012493
§ 371 (c)(1),
(2) Date: Aug. 20, 2019

(87) PCT Pub. No.: WO2018/181354
PCT Pub. Date: Oct. 4, 2018

(65) Prior Publication Data
US 2019/0375227 A1  Dec. 12, 2019

(30) Foreign Application Priority Data

Mar. 31, 2017  (JP) ................................. 2017-070529

(51) Int. Cl.
*B41N 1/12* (2006.01)
*B41F 5/24* (2006.01)

(52) U.S. Cl.
CPC . *B41N 1/12* (2013.01); *B41F 5/24* (2013.01)

(58) Field of Classification Search
None
See application file for complete search history.

(56) References Cited

FOREIGN PATENT DOCUMENTS

| | | |
|---|---|---|
| JP | 7-506201 A | 7/1995 |
| JP | 4332865 B1 | 9/2009 |
| JP | 2012-22229 A | 2/2012 |
| JP | 5573675 B2 | 8/2014 |
| WO | 2013/062082 A1 | 5/2013 |

OTHER PUBLICATIONS

International Search Report dated Jun. 26, 2018, issued in counterpart International Application No. PCT/JP2018//012493, with English translation (1 page).
Notification of Transmittal of Translation of the International Preliminary Report on Patentabililty (Form PCT/IB/338) issued in counterpart International Application No. PCT/JP2018/012493 dated Oct. 10, 2019 with Forms PCT/IB/373 and PCT/ISA/237. (5 pages).

*Primary Examiner* — Joshua D Zimmerman
(74) *Attorney, Agent, or Firm* — Westerman, Hattori, Daniels & Adrian, LLP

(57) ABSTRACT

The present invention aims to provide a photosensitive CTP flexographic printing original plate wherein no wrinkle is generated during handling of the CTP printing original plate against environmental changes throughout the year and barrier property is also excellent. A water-developable photosensitive CTP flexographic printing original plate which is characterized in that it comprises at least a support, a photosensitive resin layer, a barrier layer and a heat-sensitive mask layer which are sequentially layered, that the barrier layer contains a polyamide resin (A) containing a basic nitrogen atom in a molecule and a polyamide resin (B) containing 40 to 70% by mass of an alkylene glycol structural unit in a molecule, and that a content of the polyamide resin (B) to a total content of the polyamide resin (A) and the polyamide resin (B) is 25 to 52% by mass.

3 Claims, No Drawings

PHOTOSENSITIVE CTP FLEXOGRAPHIC PRINTING ORIGINAL PLATE

TECHNICAL FIELD OF THE INVENTION

The present invention relates to a photosensitive CTP flexographic printing original plate to be used for producing a relief printing plate according to a Computer to Plate Technique. More particularly, the present invention relates to a photosensitive CTP flexographic printing original plate which generates no wrinkle even during an operation at a low temperature.

BACKGROUND ART

In recent years, in a field of flexographic printing, a Computer to Plate Technique (CTP Technique), known as a digital image-forming technique, has been widely used as a general technique. The CTP technique is a method wherein information processed on a computer is directly outputted onto a printing plate so that a concave/convex pattern to form a relief is obtained. This technique eliminates a necessity of a step for producing a negative film, thereby making it possible to reduce cost and time required for forming the negative film.

In a CTP technique, the conventionally used negative film for covering an area being not to be photopolymerized has been substituted with a mask which is formed and integrated within a printing plate. As to a method for preparing this integrated mask, there has been widely used a method wherein an infrared-sensitive layer (heat-sensitive mask layer) which is opaque to a chemical ray is formed on a photosensitive resin layer and then this infrared-sensitive layer is evaporated using an infrared laser whereupon an image mask is formed (cf. Patent Document 1).

As to the heat-sensitive mask layer, that consisting of carbon black (a material which does not transmit any radiation) and a binder has been commonly used. The heat-sensitive mask layer is ablated by the infrared laser. Therefore, a thinner layer is preferred in view of ablation efficiency. In addition, when the film is thinner, an influence of wrinkles on the relief is also less. However, the heat-sensitive mask layer is usually demanded to have an optical density (light-shielding property) in transmission of 2.0 or more in order to inhibit transmission of the chemical radiation onto the photopolymerization layer.

The photosensitive flexographic CTP printing original plate of Patent Document 1 is constituted from the photosensitive resin layer, a protective layer and the infrared-sensitive layer. The protective layer is also called a barrier layer. The barrier layer is arranged between the photosensitive resin layer and the infrared-sensitive layer, and has an action of preventing a mass transfer between the photosensitive resin layer and the infrared-sensitive layer and also an action of preventing a polymerization inhibition in the photosensitive resin layer due to oxygen in the air whereby it plays an important role.

However, when the water-developable photosensitive resin layer as such is used as a photosensitive resin layer of the CTP plate, there is a problem of generation of wrinkles on a plate surface because of high flexibility of the photosensitive resin. The wrinkles are generated when the plate is detached and returned to a plane state after the plate is attached to a drum in a laser processing. The above problem is significant particularly when the photosensitive resin layer contains latex as a main component. It is likely to be due to a fact that the latex is present in microparticles and accordingly that the plate is much softer.

As to the problem of wrinkles, Patent Document 2 proposes compounding polyvinyl alcohol (which is a binder polymer of the protective layer (barrier layer)) with much amount of a specific plasticizer whereby the protective layer is made flexible, and generation of wrinkles is made small. In addition, Patent Document 3 proposes appropriately controlling Young's modulus and a layer thickness of the protective layer whereby generation of wrinkles is made small.

Recently, the photosensitive CTP flexographic printing original plate is becoming a main plate-making technique in place of an analog plate using the negative film. As a result, the CTP printing original plate is now used within broad environmental conditions of from an environment of high temperature and high humidity in summertime to an environment of low temperature and low humidity in wintertime. However, in the printing original plates of Patent Documents 2 and 3, it was not possible to effectively prevent the generation of wrinkles under the environment of low temperature and low humidity in wintertime. Accordingly, there has been a strong demand for a photosensitive CTP flexographic printing original plate having a protective layer (barrier layer) which exhibits such high performances that both prevention of wrinkle generation and barrier property are achieved throughout the year.

PRIOR ART DOCUMENTS

Patent Documents

Patent Document 1: Japanese Patent Application Laid-Open (JP-A) No. 506201/95
Patent Document 2: Japanese Patent No. 5573675
Patent Document 3: Japanese Patent No. 4332865

DISCLOSURE OF THE INVENTION

Problem that the Invention is to Solve

The present invention has been created in view of the above-mentioned current status of the prior art. An object of the present invention is to provide a photosensitive CTP flexographic printing original plate wherein no wrinkle is generated during the handling of the CTP printing original plate against environmental changes throughout the year and the barrier property is also excellent. A particular object thereof is to provide a photosensitive flexographic printing original plate wherein no wrinkle is generated even under the low-temperature and low-humidity condition in wintertime.

Means for Solving the Problem

The inventors have conducted eager studies for achieving the above object. As a result, they found that, when the barrier layer contains two kinds of specific polyamide resins which are a polyamide resin (A) containing a basic nitrogen atom in a molecule and a polyamide resin (B) containing an alkylene glycol structural unit in a specific rate in a molecule, it is now possible to effectively prevent the generation of wrinkles under the low-temperature and low-humidity condition in wintertime while the barrier property can be still maintained whereupon they have accomplished the present invention.

Thus, the present invention has the constitutions of the following (1) to (3).

(1) A water-developable photosensitive CTP flexographic printing original plate which is characterized in that it comprises at least a support, a photosensitive resin layer, a barrier layer and a heat-sensitive mask layer which are sequentially layered, that the barrier layer contains a polyamide resin (A) containing a basic nitrogen atom in a molecule and a polyamide resin (B) containing 40 to 70% by mass of an alkylene glycol structural unit in a molecule, and that a content of the polyamide resin (B) to a total content of the polyamide resin (A) and the polyamide resin (B) is 25 to 52% by mass.

(2) The water-developable photosensitive CTP flexographic printing original plate according to (1), wherein the polyamide resin (B) is polyether amide or polyether ester amide, and wherein the alkylene glycol structural unit is derived from polyethylene glycol or polyethylene glycol copolymer having a number-average molecular weight of 400 to 1000.

(3) The water-developable photosensitive CTP flexographic printing original plate according to (1) or (2), wherein the polyamide resin (A) is polyamide containing a piperazine ring in a molecule.

Advantages of the Invention

In accordance with the present invention, it is now possible to provide a photosensitive CTP flexographic printing original plate wherein no wrinkle is generated during the handling of the CTP printing original plate against the environmental changes throughout the year including the low-temperature and low-humidity condition in wintertime and the barrier property is also excellent.

BEST MODE FOR CARRYING OUT THE INVENTION

Hereinafter, the flexographic printing original plate of the present invention will be explained in detail.

The flexographic printing original plate of the present invention has a basic constitution wherein at least a support, a photosensitive resin layer, a barrier layer and a heat-sensitive mask layer are sequentially layered.

The support to be used for the flexographic printing original plate of the present invention is preferably made from a material being flexible and having a superior dimension stability. Examples thereof include: a support made of metal, such as steel, aluminum, copper and nickel, and a support made of a thermoplastic resin, such as a polyethylene terephthalate film, a polyethylene naphthalate film, a polybutylene terephthalate film and a polycarbonate film. Among these, the polyethylene terephthalate film, which has the superior dimension stability and a sufficiently high viscoelasticity, is in particular preferably used. A thickness of the support is set to 50 to 350 µm, preferably, to 100 to 250 µm, from viewpoints of mechanical properties, shape stability and handling characteristics during production of a printing plate. Moreover, if necessary, an adhesive may be formed between them in order to improve an adhesive property between the support and a photosensitive resin layer.

The photosensitive resin layer used for the flexographic printing original plate of the present invention contains essential components which are synthetic polymer compound, photopolymerizable unsaturated compound and photopolymerization initiator, and an optional additive such as plasticizer, thermal polymerization preventer, dye, pigment, ultraviolet absorber, fragrance or antioxidant.

A barrier layer used for the flexographic printing original plate of the present invention achieves its effect when the photosensitive resin layer which has not been photocured exhibits high flexibility. The flexibility can be evaluated by means of an amount of displacement by pushing. In the present invention, generation of wrinkles can be decreased even when the displaced amount of the photosensitive resin layer by pushing is 5 µm or more. As to the photosensitive resin layer having high flexibility, there is exemplified a photosensitive resin layer containing, as a polymer compound, a water-dispersible polymer prepared from latex.

Examples of the latex from which the water-dispersible polymer can be prepared include: water-dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex; and polymers obtained by copolymerizing another component, such as acrylic acid and methacrylic acid, therewith. Among these, water-dispersible latex polymers having a butadiene skeleton or an isoprene skeleton in molecular chains are preferably used from viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. The polymer obtained from the latex is preferred to exist as independent fine particles in the photopolymerizable unsaturated compound.

The photosensitive resin layer used for the flexographic printing original plate of the present invention may also contain, as the synthetic polymer compound, a solid synthetic rubber within such an extent that it does not lower water-developability. The specific synthetic rubber is a synthetic rubber selected from butadiene rubber, nitrile-butadiene rubber, isoprene rubber, styrene-isoprene rubber and styrene-butadiene rubber. Each of them may be used solely or two or more thereof may be used jointly. Among them, butadiene rubber and nitrile-butadiene rubber are preferred, and butadiene rubber is most preferred. Further, it is also preferred that a hydrophobic polymer obtained from water-dispersed latex of conjugated diene rubber component and the synthetic rubber have a common skeleton structure. As a result thereof, mechanical strength of the photosensitive resin layer is enhanced whereby a printing plate having high printing durability can be prepared. A compounding amount of the conjugated diene rubber component in the photosensitive resin composition constituting the photosensitive resin layer is preferred to be 1 to 10% by mass, and more preferred to be 1 to 7% by mass.

A plasticizer may be added to the photosensitive resin composition for a purpose such as to impart the flexibility. A compounding amount of the plasticizer is preferred to be 0.1 to 30% by mass, and more preferred to be 5 to 20% by mass. When the compounding amount is less than the above lower limit, the effect of imparting the flexibility to the photosensitive resin composition may become small. When it is more than the above upper limit, a problem may be resulted for the strength of the photosensitive resin composition.

Although there is no particular limitation for the plasticizer provided that it generally has a property of softening the plate materials, a plasticizer having a good compatibility with other component is preferred. To be more specific, there are exemplified a polyene compound being liquid at room temperature and a compound having an ester bond. As to the polyene compound being liquid at room temperature, there are exemplified liquid polybutadiene and polyisoprene, as well as maleic and epoxy compounds thereof wherein a terminal group or a side chain of the above has been modified. As to the compound having an ester bond, there are exemplified esters of phthalic acid, phosphoric acid, sebacic acid and adipic acid, as well as a polyester having a molecular weight of 1000 to 3000.

In the photosensitive CTP flexographic printing original plate of the present invention, it is the biggest characteristic feature to arrange a barrier layer which contains a polyamide resin (A) containing a basic nitrogen atom in a molecule and a polyamide resin (B) containing 40 to 70% by mass of an alkylene glycol structural unit in a molecule, between the photosensitive resin layer and the heat-sensitive mask layer. As a result of arranging the barrier layer containing two kinds of the specific polyamide resins as such, it is now possible to provide a flexographic CTP original plate exhibiting high performances wherein polymerization inhibition due to oxygen is prevented and thus image reproducibility is excellent, and wherein wrinkles do not generate even upon handling the CTP original plate at a low temperature.

The polyamide resin (A) containing a basic nitrogen atom in a molecule is a polyamide resin having a basic nitrogen atom in a part of a main chain or a side chain. The basic nitrogen atom is a nitrogen atom constituting an amino group which is not an amide group. As to the polyamide as such, a polyamide having a tertiary nitrogen atom in the main chain is preferred. As to the polyamide resin (A) containing a basic nitrogen atom, there is exemplified a polyamide which is prepared by copolymerization using a diamine component such as diamine having a piperazine ring, or diamine containing the basic nitrogen atom such as methylimino bispropylamine. The polyamide resin (A) is preferred to be soluble in water. It is particularly preferred in view of the water-solubility to use diamine having a piperazine ring. As to the diamine having a piperazine ring, there are exemplified 1,4-bis(3-aminoethyl)piperazine, 1,4-bis(3-aminopropyl)piperazine and N-(2-aminoethyl)-piperazine. Further, it is also possible, in view of physical properties, to copolymerize the polyamide resin (A) by partially using diamine, dicarboxylic acid, aminocarboxylic acid or the like containing no basic nitrogen atom. A method for preparing the polyamide resin containing a basic nitrogen atom in a molecule is disclosed, for example, in Japanese Patent Publication Laid-Open (JP-A) No. 7605/75.

The polyamide resin (B) containing 40 to 70% by mass of an alkylene glycol structural unit in a molecule is such a polyamide which contains 60 to 30% by mass of 6-Nylon and/or 66-Nylon and 40 to 70% by mass of an alkylene glycol constituting structural unit in the copolymerized polyamide. As to the alkylene glycol structural unit, that being derived from polyethylene glycol or a polyethylene glycol copolymer is preferred, and that being derived from polyethylene glycol is particularly preferred in view of water-developability. As to the polyethylene glycol copolymer, there is exemplified a copolymer wherein a content of polyethylene glycol is 50% by mass or more and wherein a copolymerized component is polypropylene glycol and polytetramethylene glycol. The content of the alkylene glycol structural unit is preferred to be 40 to 65% by mass. When the content of the alkylene glycol structural unit is less than the above lower limit, an amount of a polyether bond becomes too small whereby the generation of wrinkles in the operation at a low temperature cannot be prevented. In addition, a coating property of the barrier layer may be inferior. When the content of the alkylene glycol structural unit is more than the above upper limit, the resulting heat-sensitive barrier layer may become fragile and an edge reproducibility of relief halftone dots top may be inferior.

As to a number-average molecular weight of polyethylene glycol or polyethylene glycol copolymer from which the alkylene glycol structural unit derives, it is preferred to be 400 to 1000, and more preferred to be 400 to 800, in view of physical properties of a film of the barrier layer and a glass transition point. In addition, a basic nitrogen atom may be contained in a molecule of the polyamide resin (B) in order to enhance a water-solubility.

As to the polyamide resin (B) containing an alkylene glycol structural unit in a molecule, polyether amide or polyether ester amide may be used. In view of a resistance to hydrolysis, polyether amide is preferred. Polyether amide can be synthesized according to Japanese Patent Application Laid-Open (JP-A) No. 79437/80. To be more specific, acrylonitrile is added to both terminals of polyethylene glycol followed by subjecting to reduction with hydrogen so as to obtain $\alpha,\omega$-diaminopolyethylene glycol. Then, the resulting $\alpha,\omega$-diaminopolyethylene glycol is used as a diamine component whereby polyether amide can be synthesized. On the other hand, polyether ester amide can be synthesized by such a general method wherein polyethylene glycol is used as a starting material and is introduced into a molecule by means of ester bond.

In the present invention, the polyamide resin (A) containing a basic nitrogen atom in a molecule plays a role of imparting water-solubility or water-dispersibility to the barrier layer and, at the same time, imparting an appropriate hardness to the barrier layer. On the other hand, the polyamide resin (B) containing 40 to 70% by mass of an alkylene glycol structural unit in a molecule plays a role of preventing the generation of wrinkles during the handling of the CTP printing original plate. This is due to the existence of polyether bond in the alkylene glycol structural unit.

A content of the polyamide resin (B) to a total content of the polyamide resin (A) and the polyamide resin (B) in the barrier layer is 25 to 52% by mass, and preferably 20 to 50% by mass. When the content of the polyamide resin (B) is less than the above lower limit, there is a possibility that the generation of wrinkles during the operation at a low temperature cannot be prevented. On the other hand, when the content of the polyamide resin (B) is more than the above upper limit, the content of the polyamide resin (A) is too small whereby the hardness of the barrier layer may lower and the edge reproducibility of the relief halftone dots top may be inferior.

The barrier layer may contain additives within such an extent that properties thereof are not affected thereby. As to the additives, there are exemplified plasticizer and various types of stabilizers. It is also possible to compound with an additive such as an antifoaming agent or a leveling agent in order to reduce disadvantages of the barrier layer within such an extent that properties thereof are not affected thereby.

As to the antifoaming agent, there are exemplified an antifoaming agent of a lower alcohol type such as methanol or butanol, that of a silicone type, that of a mineral oil type, that of an organic polar compound type such as tributyl phosphate or oleic acid and that of a polyether type such as polypropylene glycol derivatives. A using amount thereof is usually 5% by mass or less to a mass of the barrier layer.

As to the leveling agent, there are exemplified that of an acrylic type, that of a vinyl ether type, that of a silicone type, that of a fluorine-silicone type and that of an acetylene glycol type. One of them may be used solely or two or more thereof may be used jointly. Among the leveling agents as such, it is preferred to use that of an acrylic type, that of a vinyl ether type or that of an acetylene glycol type. As a result, a surface of the resulting barrier layer can be more flattened.

In general, the barrier layer has been believed to have two kinds of functions. One is an "interlayer barrier property" which prevents a mass transfer between the adjacent photosensitive resin layer and the adjacent heat-sensitive mask layer. Another is an "oxygen barrier property" which prevents the polymerization inhibition when the whole area of the photosensitive resin layer is irradiated with an active light ray via a mask. When there is any problem in the "oxygen barrier property", it results in a cause of troubles such as that small halftone dots cannot be obtained in the prepared photosensitive printing original plate or that a shape of an end part of the small halftone dots becomes round. Accordingly, it is important whether a halftone dot diameter having a predetermined size can be obtained.

The heat-sensitive mask layer used in the flexographic printing original plate of the present invention is constituted from carbon black (which is a material having a function of absorbing infrared laser and converting it into heat, and a function of shielding from ultraviolet ray), a dispersing binder therefor and a binder polymer which can form a film. It is also possible to use a single substance acting as the dispersing binder and also as the binder which can form a film. As to optional components other than the above, it is also possible to contain a dispersing agent for pigment, a filler, a surfactant, an application aid or the like within such an extent that it does not deteriorate effects of the present invention.

Although the heat-sensitive mask layer used in the flexographic printing original plate of the present invention is not particularly limited, it is preferred to be water-developable. As to the specific heat-sensitive mask layer, there are exemplified a heat-sensitive mask layer wherein polyamide containing a polar group is combined with butyral resin (Japanese Patent No. 4200510), a heat-sensitive mask layer which contains a polymer having the same structure as a polymer in the photosensitive resin layer and an acrylic resin (Japanese Patent No. 5710961), and a heat-sensitive mask layer which contains an anionic polymer and a polymer having an ester bond in a side chain and having a degree of saponification of 0% to 90% (Japanese Patent No. 5525074).

Although there is no particular limitation for a method for producing the flexographic printing original plate of the present invention, the plate is usually produced as mentioned below.

Thus, the components constituting the heat-sensitive mask layer (such as a binder) other than carbon black are dissolved in a suitable solvent and then carbon black is dispersed therein to prepare a dispersion. Then the dispersion as such is applied onto a support (such as a polyethylene terephthalate film) for the heat-sensitive mask layer. Then the solvent is evaporated therefrom. After that, a component for the barrier layer is applied thereon whereupon one laminate is prepared. Further, apart therefrom, the photosensitive resin layer is formed on another support by means of application whereupon another laminate is prepared. The two laminates prepared as such are layered under pressurization and/or heating in such a manner that the photosensitive resin layer adjacently contacts a barrier layer. Incidentally, after completion of the printing original plate, the support for the heat-sensitive mask layer functions as a protective film for a surface thereof.

Now, a method for producing a printing plate from the CTP printing original plate of the present invention will be explained. When the protective film is present, the protective film is firstly removed from the photosensitive printing original plate. Thereafter, the heat-sensitive mask layer is imagewise-irradiated with an IR laser so that a mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, CDI Spark (manufactured by Esko-Graphics Co., Ltd.) may be used. This laser system includes a rotation cylinder drum used for holding a printing original plate, an IR laser irradiating device and a layout computer. Image information is directly transferred from the layout computer to the laser device.

After the image information has been written in the heat-sensitive mask layer, active light rays are applied onto an entire surface of the photosensitive printing original plate via the mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed so that the printing plate is obtained. The developing process can be carried out by using a commonly-used developing unit.

EXAMPLES

The present invention will now be illustrated in more detail by way of the following Examples although the present invention is not limited thereto. In Examples (the main text), the term "part(s)" stands for part(s) by mass.

Hereinafter, materials used in each Example will be explained.

<Synthesis of Polyamide Resin (A) Containing a Basic Nitrogen Atom>

A-1: ε-Caprolactam (520 parts by mass), 400 parts by mass of 1,4-bis(3-aminopropyl)piperazine adipate, 80 parts by mass of 3-bisaminomethylcyclohexane adipate and 1000 parts by mass of water were charged into an autoclave. After substituting with nitrogen, the autoclave was tightly closed and gradually heated. Starting from a stage when an inner pressure reached 1 MPa, water was evaporated therefrom until the pressure could no longer be maintained. The pressure was returned to atmospheric within about 2 hours. Then, a reaction was conducted at an atmospheric pressure for 1 hour. The highest temperature for the polymerization reaction was 255° C. As a result, there was obtained a polyamide resin containing a basic nitrogen atom.

A-2: ε-Caprolactam (90 parts by mass), 910 parts by mass of salt of N-(2-aminoethyl)piperazine and adipic acid with Nylon and 1000 parts by mass of water were charged into an autoclave. After an inner air was substituted with nitrogen, heating was conducted at 200° C. for 1 hour. Then, water was removed to give a water-soluble polyamide resin containing a basic nitrogen atom.

A-3: ε-Caprolactam (540 parts by mass), 380 parts by mass of 1,4-bis(3-aminoethyl)piperazine adipate, 80 parts by mass of 3-bisaminomethylcyclohexane adipate and 1000 parts by mass of water were charged into an autoclave. After substituting with nitrogen, the autoclave was tightly closed and gradually heated. Starting from a stage when an inner pressure reached 1 MPa, water was evaporated therefrom until the pressure could no longer be maintained. The pressure was returned to atmospheric within about 2 hours. Then, a reaction was conducted at an atmospheric pressure for 1 hour. The highest temperature for the polymerization reaction was 255° C. As a result, there was obtained a polyamide resin containing a basic nitrogen atom.

<Synthesis of Polyamide Resin (B) Containing an Alkylene Glycol Structural Unit>

B-1: An equimolar salt (790 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 210 parts by mass of ε-caprolactam under conventional conditions. The resulting polyamide was a PEG-containing polyamide resin which contains 59% by mass of an alkylene glycol structural unit in a molecule.

B-2: An equimolar salt (604 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 396 parts by mass of ε-caprolactam in the same way as B-1. The resulting polyamide was a PEG-containing polyamide resin which contains 45% by mass of an alkylene glycol structural unit in a molecule.

B-3: An equimolar salt (839 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 261 parts by mass of ε-caprolactam in the same way as B-1. The resulting polyamide was a PEG-containing polyamide resin which contains 55% by mass of an alkylene glycol structural unit in a molecule.

B-4: An equimolar salt (790 parts by mass) of adipic acid with α,ω-diaminopolyethylene glycol prepared by addition of acrylonitrile to both terminals of polyethylene glycol having a number-average molecular weight of 500 followed by subjecting to reduction with hydrogen was subjected to melt polymerization with 210 parts by mass of ε-caprolactam under conventional conditions. The resulting polyamide was a PEG-containing polyamide resin which contains 54% by mass of an alkylene glycol structural unit in a molecule.

B-5: An equimolar salt (730 parts by mass) of adipic acid with α,ω-diaminopolyethylene glycol prepared by addition of acrylonitrile to both terminals of polyethylene glycol having a number-average molecular weight of 800 followed by subjecting to reduction with hydrogen was subjected to melt polymerization with 270 parts by mass of ε-caprolactam under conventional conditions. The resulting polyamide was a PEG-containing polyamide resin which contains 57% by mass of an alkylene glycol structural unit in a molecule.

B-6: An equimolar salt (987 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 13 parts by mass of ε-caprolactam in the same way as B-1. The resulting polyamide was a PEG-containing polyamide resin which contains 74% by mass of an alkylene glycol structural unit in a molecule.

B-7: An equimolar salt (120 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 880 parts by mass of ε-caprolactam in the same way as B-1. The resulting polyamide was a PEG-containing polyamide resin which contains 9% by mass of an alkylene glycol structural unit in a molecule.

B-8: An equimolar salt (605 parts by mass) of adipic acid with α,ω-diaminopolyethylene glycol prepared by addition of acrylonitrile to both terminals of polyethylene glycol having a number-average molecular weight of 600 followed by subjecting to reduction with hydrogen was subjected to melt polymerization with 395 parts by mass of ε-caprolactam under conventional conditions. The resulting polyamide was a PEG-containing polyamide resin which contains 35% by mass of an alkylene glycol structural unit in a molecule.

A content of the alkylene glycol structural unit in each molecule of the resulting polyamide resins B-1 to B-8 was calculated from charging amounts of the materials.

<Preparation of Applying Solution Composition for Barrier Layer>

The polyamide resin (A) and the polyamide resin (B) in a composition ratio as shown Table 1 were dissolved in ethanol at 60° C. so as to make a solid concentration 10% by mass whereupon the applying solution composition for the barrier layer was prepared.

<Preparation of Heat-Sensitive Mask Layer>

As to an applying solution for the heat-sensitive mask layer, there was used a mixture of a carbon black dispersion (AMBK-8 manufactured by Orient Kagaku Kogyo) and a copolymerized polyamide. A mixing rate of the components in the mixture in terms of a ratio by mass of a solid was that (carbon black):(butyral resin):(copolymerized polyamide) =35:28:37. After that, the applying solution for the heat-sensitive mask layer was applied, using a bar coater #12, on both sides of a PET film (E5000 in 100 μm thickness manufactured by Toyobo) which has been subjected to a releasing treatment and dried at 120° C. for 5 minutes. An optical density at that time was 2.3. This optical density was measured by a monochromatic transmission densitometer DM-520 (manufactured by Dainippon Screen).

<Preparation of Film of Heat-Sensitive Mask Layer Laminate with Barrier Layer>

The applying solution for the barrier layer was applied on the prepared heat-sensitive mask layer using a suitable type of a bar coater so as to give a desired thickness and then dried at 120° C. for 5 minutes to prepare the film of the heat-sensitive mask layer laminate wherein the barrier layer was arranged on an uppermost layer.

<Preparation of Photosensitive Resin Composition for Photosensitive Resin Layer>

An acrylonitrile-butadiene latex (Nipol SX1503 containing 42% of nonvolatile matters; manufactured by Nippon Zeon) (10 parts by mass), 58 parts by mass of a butadiene latex (Nipol LX111NF containing 55% of nonvolatile matters; manufactured by Nippon Zeon), 28 parts by mass of oligobutadiene acrylate (ABU-2S manufactured by Kyoeisha Kagaku), 4 parts by mass of lauryl methacrylate (Light Ester L manufactured by Kyoeisha Kagaku), 4 parts by mass of dimethylol tricyclodecane diacrylate, 1 part by mass of benzyl dimethylketal as a photopolymerization initiator, 0.1 part by mass of hydroquinone monomethyl ether as a polymerization inhibitor and 0.1 part by mass of a nonionic surfactant as an other additive were mixed in a container together with 15 parts by mass of toluene. Then, they were kneaded at 105° C. using a pressure kneader. After that, toluene and water were removed therefrom in vacuo to prepare the photosensitive resin composition used for the photosensitive resin layer. When the displaced amount of this composition by pushing was measured, it was 15 μm.

<Preparation of Printing Original Plate>

The above photosensitive resin composition was arranged onto a PET film support (E5000 in 125 μm thickness manufactured by Toyobo) being applied with a polymerized polyester adhesive. After that, the film of the heat-sensitive mask layer laminate wherein the barrier layer was arranged on the uppermost layer was laid on a top thereof. Lamination was conducted at 100° C. using a heat press machine to give the flexographic printing original plate consisting of the PET film support, the adhesive layer, the photosensitive resin layer, the protective layer, the heat-sensitive mask layer and the PET protective film (cover film) having been subjected to the releasing treatment. A total thickness of the plate was 1.90 mm.

<Production of Printing Plate from Printing Original Plate>

A PET support side of the original plate was irradiated with a chemical ray (light source: Philips 10R; illuminance at 365 nm: 8 mW/cm$^2$) for 1 minute. After that, the PET film (cover film) having been subjected to the releasing treatment was peeled off. This plate was wound around a rotating drum of Digital Imager Spark (manufactured by Barco) so that the heat-sensitive mask layer came to a surface side. Then it was vacuated and image formation was conducted thereafter. After an ablation, the plate was taken out and retuned to a flat shape, and then was irradiated with the chemical ray (light source: Philips 10R; illuminance at 365 nm: 8 mW/cm$^2$) for 6 minutes. After that, the plate was developed at 40° C. for 8 minutes using a developer (Stuck System) manufactured by A&V. As to a developer, there was used tap water to which 1% of a tableware detergent (Cascade manufactured by P&G of the USA) was added. After the development, the plate was dried at 60° C. for 10 minutes, was irradiated with the chemical ray for 10 minutes and, finally, was irradiated with a germicidal lamp for 5 minutes in order to remove a surface viscosity.

<Evaluation Method>

Resistance to wrinkle: The prepared flexographic printing original plate was cut into a size of 20 cm width and 20 cm length to give a sample for evaluation. The sample was stored on a flat stand in a thermostat chamber of 10° C. or 30° C. under a condition of 25% relative humidity to condition the sample. After that, a cover sheet of the sample was peeled off. Then, the sample was wound around a cylindrical roll (diameter: 200 mm) so that the barrier layer came to a surface side, fixed for 5 minutes, detached therefrom and allowed to stand in a flat place for 5 minutes. After that, a surface of the barrier layer was observed by naked eye. Resistance to wrinkle was judged according to the following criteria.

○: No wrinkle was confirmed on the barrier layer

Δ: Wrinkles were partially confirmed on the barrier layer x: Wrinkles were confirmed on whole surface of the barrier layer Coating property of barrier layer: The barrier layer of the present invention was subjected to hand-coating on a PET film of an A4 size using a bar coater at ambient temperature to prepare a sample. After the hand-coating, the sample was placed in a hot-air drier set at 100° C. and allowed to stand for 10 minutes. After that, the sample was taken out from the hot-air drier and a surface of the barrier layer was observed by naked eye. Coating property of the barrier layer was judged according to the following criteria.

○: Coated surface of the barrier layer was flat and smooth x: Defects such as streaks and repelled traces were confirmed on the coated surface of the barrier layer Water-developability: The prepared flexographic printing original plate was immersed in a developer and rubbed with a brush exclusively for a developing machine at 40° C. for 5 minutes. Water-developability of the barrier layer was judged according to the following criteria.

○: Water-developing of the barrier layer was possible x: Water-developing of the barrier layer was not possible Edge reproducibility of top of relief halftone dots: Shape of a top of 150-line 2% halftone dots was evaluated using a CTP layer corresponding to 150-line 2% of a negative film. The evaluation was conducted by observing a cross section of the shape of a top of 150-line 2% halftone dots enlarged to an extent of 100 magnifications using a microscope. Edge reproducibility was judged according to the following judging criteria.

○: In the top of halftone dots, a diameter of a flat area reproduced an area corresponding to 150-line 2% of the negative film and there was no roundness in a shape of an edge area.

Δ: In the top of halftone dots, the flat area was smaller than the area corresponding to 150-line 2% of the negative film and there was roundness in the shape of the edge area.

x: In the top of halftone dots, no flat area was observed and the shape of the edge area was round.

Measurement of an amount of displacement by pushing: A disk-shaped penetrator of 10 mm diameter was loaded with 120-gram weight for 60 seconds onto a printing original plate wherein a photosensitive resin layer in 1.70 mm thickness was arranged on a support. The amount of displacement at that time was measured using LINEAR SENSOR (GS-112) manufactured by ONO SOKKI. When the amount of displacement by pushing is higher, the plate is softer.

Example 1

The heat-sensitive mask layer prepared in <Preparation of heat-sensitive mask layer> was provided. Then, an applying solution composition was prepared in accordance with <Preparation of applying solution composition for barrier layer>, in a composition ratio of the barrier layer of Example 1 shown in Table 1. Then, application and drying were conducted on the heat-sensitive mask layer so that a thickness of the barrier layer was made 1.5 μm according to <Preparation of film of heat-sensitive mask layer laminate with barrier layer> whereupon there was obtained a film of the heat-sensitive mask layer laminate wherein the barrier layer was arranged on an uppermost layer. The resulting film of the heat-sensitive mask layer laminate was laminated with the photosensitive resin layer according to <Preparation of printing original plate> to give a flexographic printing original plate consisting of the PET support, the adhesive layer, the photosensitive resin layer, the protective layer, the heat-sensitive mask layer and the PET protective film (cover film) having been subjected to the releasing treatment. A total thickness of the plate was 1.90 mm. Incidentally, as to the photosensitive resin layer used in Example 1, that which was prepared according to <Preparation of photosensitive resin composition for photosensitive resin layer> was used.

Examples 2 to 9 and Comparative Examples 1 to 5

According to the production method of Example 1, the photosensitive resin layer of Example 1 was laminated with a film provided with the heat-sensitive mask layer prepared according to a composition (ratio by mass) of the heat-sensitive mask layer mentioned in Table 1 to give a flexographic printing original plate consisting of the PET support, the adhesive layer, the photosensitive resin layer, the protective layer, the heat-sensitive mask layer and the PET protective film (cover film) having been subjected to the releasing treatment. A total thickness of the plate was 1.90 mm. Evaluation of the properties was done using the resulting heat-sensitive mask layer and CTP flexographic printing original plate. Results of those property evaluations are shown in the following Table 1.

contrary, Comparative Example 1 wherein a content of the polyamide resin (B) is small is inferior in the resistance to wrinkle. Comparative Example 2 wherein the content of the polyamide resin (B) is large and Comparative Example 3 wherein a content of alkylene glycol structural unit in the polyamide resin (B) is large are inferior in the edge reproducibility of top of relief halftone dots. Comparative Examples 4 and 5 wherein the content of the alkylene glycol structural unit in the polyamide resin (B) is small are inferior in the resistance to wrinkle at low temperature, the coating property of the barrier layer and the edge reproducibility of top of relief halftone dots.

INDUSTRIAL APPLICABILITY

In accordance with the present invention, it is now possible to provide a photosensitive CTP flexographic printing original plate wherein no wrinkle is generated during the handling of the CTP printing original plate against the environmental changes throughout the year including the low-temperature and low-humidity condition in wintertime and the barrier property is also excellent. Consequently, the present invention is very useful.

TABLE 1

|  |  |  | Example 1 | Example 2 | Example 3 | Example 4 | Example 5 | Example 6 | Example 7 |
|---|---|---|---|---|---|---|---|---|---|
| Polyamide resin (% by mass) | Polyamide resin (A) containing a piperazine ring | A-1 | 70.0 | 60.0 | 50.0 | 60.0 |  |  | 60.0 |
|  |  | A-2 |  |  |  |  | 60.0 |  |  |
|  |  | A-3 |  |  |  |  |  | 60.0 |  |
|  | PEG-containing polyamide resin (B) | B-1 | 30.0 | 40.0 | 50.0 |  | 40.0 | 40.0 |  |
|  |  | B-2 |  |  |  | 40.0 |  |  |  |
|  |  | B-3 |  |  |  |  |  |  | 40.0 |
|  |  | B-4 |  |  |  |  |  |  |  |
|  |  | B-5 |  |  |  |  |  |  |  |
|  |  | B-6 |  |  |  |  |  |  |  |
|  |  | B-7 |  |  |  |  |  |  |  |
|  |  | B-8 |  |  |  |  |  |  |  |
|  | (B)/[(A) + (B)] × 100 |  | 30.0 | 40.0 | 50.0 | 40.0 | 40.0 | 40.0 | 40.0 |
| Results of evaluation | Resistance to wrinkle | 10° C., RH25% | ○ | ○ | ○ | ○ | ○ | ○ | ○ |
|  |  | 30° C., RH25% | ○ | ○ | ○ | ○ | ○ | ○ | ○ |
|  | Coating property of barrier layer |  | ○ | ○ | ○ | ○ | ○ | ○ | ○ |
|  | Water-developability |  | ○ | ○ | ○ | ○ | ○ | ○ | ○ |
|  | Edge reproducibility of top of relief halftone dots |  | ○ | ○ | ○ | ○ | ○ | ○ | ○ |

|  |  |  | Example 8 | Example 9 | Comparative Example 1 | Comparative Example 2 | Comparative Example 3 | Comparative Example 4 | Comparative Example 5 |
|---|---|---|---|---|---|---|---|---|---|
| Polyamide resin (% by mass) | Polyamide resin (A) containing a piperazine ring | A-1 | 60.0 | 60.0 | 80.0 | 45.0 | 50.0 | 60.0 | 60.0 |
|  |  | A-2 |  |  |  |  |  |  |  |
|  |  | A-3 |  |  |  |  |  |  |  |
|  | PEG-containing polyamide resin (B) | B-1 |  |  | 20.0 | 55.0 |  |  |  |
|  |  | B-2 |  |  |  |  |  |  |  |
|  |  | B-3 |  |  |  |  |  |  |  |
|  |  | B-4 | 40.0 |  |  |  |  |  |  |
|  |  | B-5 |  | 40.0 |  |  |  |  |  |
|  |  | B-6 |  |  |  |  | 50.0 |  |  |
|  |  | B-7 |  |  |  |  |  | 40.0 |  |
|  |  | B-8 |  |  |  |  |  |  | 40.0 |
|  | (B)/[(A) + (B)] × 100 |  | 40.0 | 40.0 | 20.0 | 55.0 | 50.0 | 40.0 | 40.0 |
| Results of evaluation | Resistance to wrinkle | 10° C., RH25% | ○ | ○ | × | ○ | ○ | △ | △ |
|  |  | 30° C., RH25% | ○ | ○ | △ | ○ | ○ | ○ | ○ |
|  | Coating property of barrier layer |  | ○ | ○ | ○ | ○ | ○ | × | × |
|  | Water-developability |  | ○ | ○ | ○ | ○ | ○ | ○ | ○ |
|  | Edge reproducibility of top of relief halftone dots |  | ○ | ○ | ○ | × | × | △ | △ |

As will be noted from Table 1, Examples 1 to 9 satisfying the constituting requirements of the present invention are excellent in any of the resistance to wrinkle, the coating property of the barrier layer, the water-developability and the edge reproducibility of top of relief halftone dots. On the

The invention claimed is:

1. A water-developable photosensitive Computer To Plate (CTP) flexographic printing original plate which is characterized in that it comprises at least a support, a photosensitive resin layer, a barrier layer and a heat-sensitive mask layer which are sequentially layered, that the barrier layer contains a polyamide resin (A) containing a basic nitrogen atom in a molecule and a polyamide resin (B) containing 40 to 70% by mass of an alkylene glycol structural unit in a molecule, and that a content of the polyamide resin (B) to a total content of the polyamide resin (A) and the polyamide resin (B) is 25 to 52% by mass.

2. The water-developable photosensitive CTP flexographic printing original plate according to claim 1, wherein the polyamide resin (B) is polyether amide or polyether ester amide, and wherein the alkylene glycol structural unit is derived from polyethylene glycol or polyethylene glycol copolymer having a number-average molecular weight of 400 to 1000.

3. The water-developable photosensitive CTP flexographic printing original plate according to claim 1, wherein the polyamide resin (A) is polyamide containing a piperazine ring in a molecule.

\* \* \* \* \*